United States Patent
Nakasuga et al.

(10) Patent No.: US 10,099,386 B2
(45) Date of Patent: Oct. 16, 2018

(54) SUCTION NOZZLE

(71) Applicant: Kyocera Corporation, Kyoto (JP)

(72) Inventors: Minoru Nakasuga, Satsumasendai (JP); Yasuyuki Hiromasa, Satsumasendai (JP); Muneki Koga, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/546,690

(22) PCT Filed: Jan. 27, 2016

(86) PCT No.: PCT/JP2016/052325
§ 371 (c)(1),
(2) Date: Jul. 27, 2017

(87) PCT Pub. No.: WO2016/121812
PCT Pub. Date: Aug. 4, 2016

(65) Prior Publication Data
US 2018/0021959 A1   Jan. 25, 2018

(30) Foreign Application Priority Data

Jan. 28, 2015  (JP) .................................. 2015-014431

(51) Int. Cl.
*C04B 35/48* (2006.01)
*B25J 15/06* (2006.01)
(Continued)

(52) U.S. Cl.
CPC .......... *B25J 15/0616* (2013.01); *B25J 15/06* (2013.01); *C04B 35/48* (2013.01); *C04B 35/486* (2013.01);
(Continued)

(58) Field of Classification Search
CPC ................. B25J 15/0616; C04B 35/48; C04B 2235/3244; C04B 2235/9661; C09C 1/0009; H05K 13/0408
(Continued)

(56) References Cited

U.S. PATENT DOCUMENTS 4,916,022 A * 4/1990 Solfest .................. C23C 14/083
416/241 B
2011/0070441 A1   3/2011 Mikaki et al.

FOREIGN PATENT DOCUMENTS

EP   2248784 A1   11/2010
JP   2008063154 A   3/2008
(Continued)

OTHER PUBLICATIONS

The extended European Search Report based on Application No. 16743415.8 (7 Pages) dated Dec. 5, 2017 (Reference Purpose Only).
(Continued)

*Primary Examiner* — Gabriela M Puig
(74) *Attorney, Agent, or Firm* — Viering, Jentschura & Partner MBB

(57) ABSTRACT

A suction nozzle includes zirconia-based ceramics. The ceramics includes first grains and second grains. The first grains each contain zirconia, and the second grains each contain a black-colored component. The suction nozzle includes a suction face and a suction hole. The suction hole is in communication with the suction face. In the suction face, an area ratio of an area occupied by the second grains to a measurement face obtained by polishing the suction face is greater than or equal to 17% but less than or equal to 34%. A number of the second grains in an area of 90 μm² in the measurement face is greater than or equal to 150 but less than or equal to 250.

5 Claims, 3 Drawing Sheets

(51) Int. Cl.
| | |
|---|---|
| *H05K 13/04* | (2006.01) |
| *C09C 1/00* | (2006.01) |
| *C04B 35/486* | (2006.01) |
| *C04B 35/626* | (2006.01) |
| *C04B 35/632* | (2006.01) |
| *C04B 35/634* | (2006.01) |

(52) U.S. Cl.
CPC ........ *C04B 35/6261* (2013.01); *C04B 35/632* (2013.01); *C04B 35/63424* (2013.01); *C09C 1/0009* (2013.01); *H05K 13/04* (2013.01); *H05K 13/0408* (2013.01); *C04B 2235/3232* (2013.01); *C04B 2235/3241* (2013.01); *C04B 2235/3244* (2013.01); *C04B 2235/3272* (2013.01); *C04B 2235/5445* (2013.01); *C04B 2235/785* (2013.01); *C04B 2235/963* (2013.01); *C04B 2235/9661* (2013.01)

(58) Field of Classification Search
USPC .................................................. 294/183, 185
See application file for complete search history.

(56) References Cited

FOREIGN PATENT DOCUMENTS

| | | |
|---|---|---|
| JP | 2009063565 A | 3/2009 |
| JP | 2011049551 A | 3/2011 |
| JP | 2013056809 A | 3/2013 |
| WO | 2009099184 A1 | 8/2009 |

OTHER PUBLICATIONS

International Search Report based on Application No. PCT/JP2016/052325 (2 Pages and 2 Pages of English translation) dated Mar. 1, 2016 (Reference Purpose Only).

\* cited by examiner

SUCTION NOZZLE

RELATED APPLICATIONS

The present application is a national stage entry according to 35 U.S.C. § 371 of PCT application No.: PCT/JP2016/052325 filed on Jan. 27, 2016 which claims priority from Japanese application No.: 2015-014431 filed on Jan. 28, 2015, and is incorporated herein by reference in its entirety.

TECHNICAL FIELD

Embodiments in the present disclosure generally relate to a suction nozzle, more particularly relates to a suction nozzle containing zirconia based ceramics.

BACKGROUND

Heretofore it has been customary to use a mounting apparatus equipped with a placement machine for the mounting of an electronic component on a circuit board. At first, an electronic component is sucked by a suction nozzle disposed in the placement machine whereupon the electronic component is attracted to the suction face of the suction nozzle. After that, the electronic component is conveyed, while being maintained in an attracted state, so as to be mounted at a predetermined position of a circuit board. In order to mount the electronic component accurately at the predetermined position of the circuit board, the mounting apparatus includes optical devices to grasp the shape of the electronic component and electrode positions (hereafter referred to as "detection of electronic component position").

The optical devices as mentioned herein include an illuminating device, a CCD camera, an image analyzer connected to the CCD camera, and so forth. Detection of electronic component position using the optical devices is effected in the following manner. To begin with, light is applied to the electronic component from the illuminating device. Next, the CCD camera receives light reflected from the electronic component. Then, the image analyzer analyzes the reflected light received by the CCD camera. The detection of electronic component position is achieved through the above-described sequential operation, whereby, for example, a position of the electronic component is corrected.

Thus, the detection of electronic component position is effected through the analysis of reflected light from the electronic component. The electronic component has a white color tone, wherefore a suction nozzle having a black color tone is utilized.

Known zirconia-toughened alumina ceramics has a black color tone.

SUMMARY

A suction nozzle is disclosed. In an embodiment, the suction nozzle includes zirconia ceramics. The ceramics contains first grains and second grains. The first grains contain zirconia and the second grains contain a component of a black color. The suction nozzle includes a suction face, and a suction hole. The suction hole is in communication with the suction face. The suction face includes a measurement face that is obtained by polishing the suction face for measurements. The measurement face that is polished has an area ratio of a total area of the second grains within the measurement face to an area of a measurement face of greater than or equal to 17% and less than or equal to 34%. A number of the second grains in an area of 90 $\mu m^2$ in the measurement face is 150 to 250.

DETAILED DESCRIPTION

Figure 1:
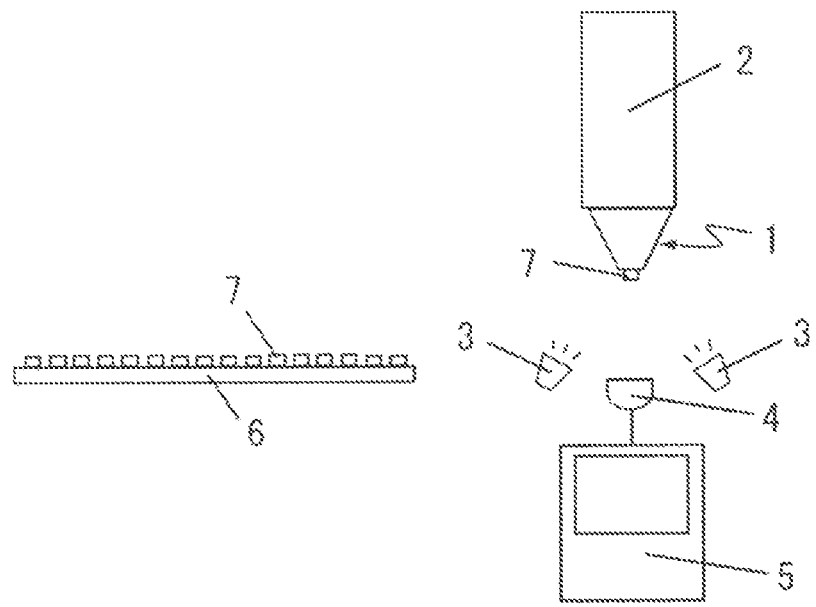
FIG. 1 is a schematic view illustrating a mounting apparatus according to an embodiment of the present disclosure.

Recently, electronic components have come to be increasingly smaller, and their packing density is on the increase. In keeping with this trend, to increase the degree of accuracy with which an electronic component is mounted on a circuit board (or mounting accuracy), accurate detection of electronic component position needs to be improved. Moreover, with downsizing of electronic components, area of a suction face of a suction nozzle is getting smaller. Consequently, as the area of the suction face decreases, a ratio of ceramic grain size to the area of the suction face increases. Hence, a suction nozzle that is composed of ceramics needs to be resistant to ceramic grain shedding (hereafter referred to as "grain drop").

A suction nozzle according to the present disclosure is less prone to grain drop even if an electronic component is attached thereto and detached therefrom repeatedly (hereafter referred to as "attachment and detachment"), and thus achieves detection of electronic component position in image recognition with high accuracy. Hence, the accuracy of mounting an electronic component on a circuit board can be enhanced.

Hereinafter, the suction nozzle according to the present disclosure will be described in detail with reference to drawings. Note that same reference symbols are used in the drawings to denote members having the same structure and function. Moreover, the drawings are merely schematic representations, and therein structures are not illustrated in an exact manner in respect of size, positional relationship, and so forth.

A mounting apparatus used for mounting an electronic component 7 on a circuit board will be described with reference to FIG. 1. The mounting apparatus is composed of a placement machine 2 that includes a suction nozzle 1 and an optical device. The optical device includes a light 3, a CCD camera 4, and an image analyzer 5. The light 3 applies light to the electronic component 7 attached to the suction nozzle 1. The CCD camera 4 receives light reflected from the electronic component 7. The image analyzer 5 analyzes the reflected light received by the CCD camera 4. The electronic components 7 are arranged on a tray 6 disposed in the vicinity of the mounting apparatus.

The following describes a method for mounting the electronic component 7 using the mounting apparatus. The placement machine 2 is moved to the tray 6. Then, the suction nozzle 1 vacuums up the electronic component 7 that is located on the tray 6. Then, the placement machine 2 is moved to a space above the CCD camera 4 while the electronic component 7 is kept attached to a suction face of the suction nozzle 1. The electronic component 7 is irradiated with light from the light 3. Then, the CCD camera 4 receives the light which has been applied to and reflected from the main body and the electrode of the electronic component 7. On the basis of the reflected light received by the CCD camera 4, the image analyzer 5 detects a position of the electronic component 7. Finally, on the basis of information on the position of the electronic component 7, the suction nozzle 1 to which the electronic component 7 is attached is moved to a predetermined location of a circuit board (not shown in the drawing) and the electronic component 7 is mounted on the circuit board.

Next, a suction nozzle 1 according to an embodiment of the present disclosure will be described with reference to FIGS. 2A and 2B.

Figure 2A:
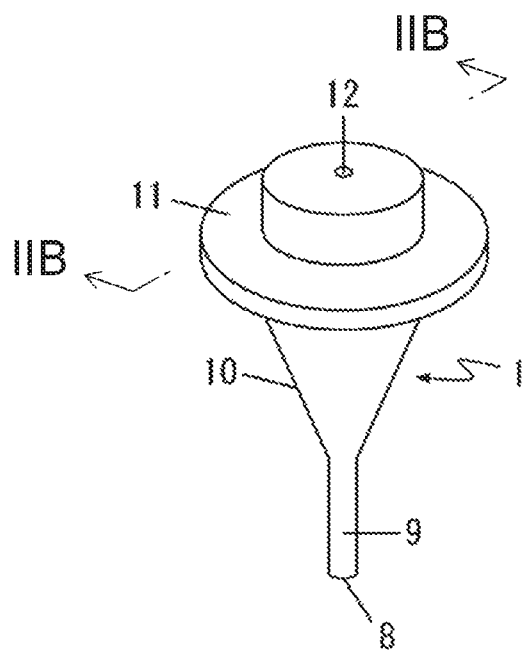
FIG. 2A is a perspective view of the suction nozzle.
Figure 2B:
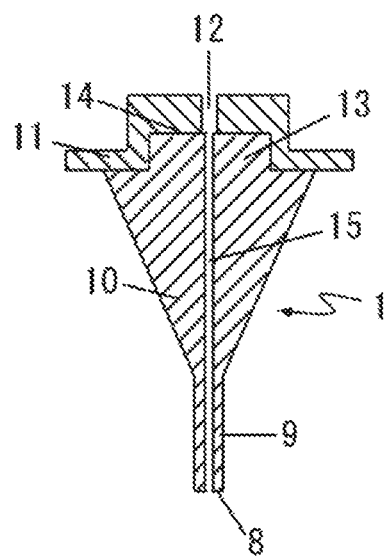
FIG. 2B is a longitudinal cross-sectional view of the suction nozzle according to an embodiment of the present disclosure.

The suction nozzle 1 as shown in FIGS. 2A and 2B includes a cylindrical portion 9 having a suction face 8 at a front end thereof, and a conical portion 10 which is tapered toward the cylindrical portion 9 and includes a projection 13 on a side opposite the suction face 8 of the cylindrical portion 9. The suction face 8 is for making the electronic component 7 attached thereto by suction. The suction nozzle 1 includes a suction hole 15 passing therethrough so as to extend from the conical portion 10 through the cylindrical portion 9 to the suction face 8.

The suction nozzle 1 may be attached to the placement machine 2 through engagement with a holding member 11 secured to the placement machine 2. The holding member 11 as shown in FIGS. 2A and 2B includes a recess 14 that is disposed at a center thereof for engagement with the projection 13 of the conical portion 10. A suction hole 12 is located at a center of the recess 14 so as to communicate with the suction hole 15. The suction nozzle 1 can be attached to the placement machine 2 by bringing about engagement between the projection 13 of the conical portion 10 and the recess 14 of the holding member 11.

The suction nozzle 1 according to the present disclosure is formed of zirconia ceramics. The ceramics includes first grains containing zirconia and second grains containing a component having a black color. An area ratio of area occupied by the second grains to area of a measurement face that is obtained by polishing the suction face 8 is greater than or equal to 17% but less than or equal to 34%. Moreover, a number of the second grains in an area of 90 μm$^2$ in the measurement face is greater than or equal to 150 but less than or equal to 250. The measurement face refers to a face obtained by mirror-polishing the suction face 8 in the direction of length of the suction nozzle 1 by an amount of about 0.1 to 5 μm with use of diamond abrasive grains.

Moreover, the component having the black color contained in the second grain refers to an oxide or composite oxide of elements belonging to Groups 4 to 10 in the periodic table of the element which has a black color tone. Specifically, the elements belonging to Groups 4 to 10 in the periodic table include iron, chromium, cobalt, manganese, nickel, and titanium.

Figure 3:
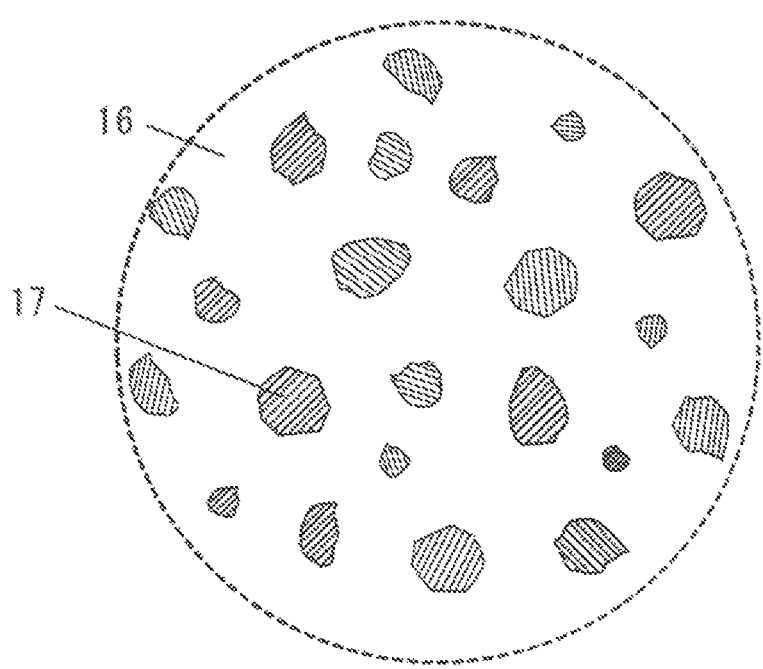
FIG. 3 is an enlarged view of a measurement face obtained by polishing the suction face of the suction nozzle according to an embodiment of the present disclosure.

Referring to FIG. 3 which is an enlarged view schematically illustrating an example of the measurement face, the first grain 16 and the second grain 17 will be described. To avoid complication of the drawing, the illustration of the grain shape of the first grain 16 is omitted from FIG. 3.

FIG. 3 may, in other words, be a schematic representation of the measurement face as observed using a scanning electron microscope (SEM) and so forth. The first grain 16 has a white color tone. On the other hand, the second grain 17 has a black color tone. Hence, the first grain 16 and the second grain 17 are distinguishable by visual check. Moreover, the components of the first grain 16 and the second grain 17 can be examined by wavelength dispersive X-ray microanalyzer (Type JXA-8600M manufactured by JEOL Ltd.). Although the first grain 16 contains zirconia, hafnium or a stabilizing agent may sometimes be detected therein as well as zirconia.

In the suction nozzle 1 according to the present disclosure, the area ratio of an area occupied by the second grains 17 to an area of the measurement face is greater than or equal to 17% but less than or equal to 34%, and, the number of the second grains 17 in an area of 90 μm$^2$ in the measurement face is greater than or equal to 150 but less than or equal to 250. This requirement helps to reduce grain drop even with repeated attachment and detachment of the electronic component 7. Moreover, by virtue of its black color tone with low reflectivity, the suction nozzle 1 according to the present disclosure achieves detection of the position of the electronic component 7 in image recognition with high accuracy. Hence, the suction nozzle 1 according to the present disclosure is capable of enhancement in the accuracy of mounting the electronic component 7 on a circuit board.

When the area ratio of an area occupied by the second grains 17 to an area of the measurement face exceeds 34%, the mechanical strength of zirconia ceramics decreases, and consequently, as the attachment and detachment of the electronic component 7 are repeated, grain drop tends to occur in the suction face 8. Furthermore, an increase in reflectivity at a part subjected to grain drop makes it impossible to enhance the accuracy of detection of the position of the electronic component 7 in image recognition. On the other hand, when the area ratio of an area occupied by the second grains 17 to an area of the measurement face is less than 17%, the brightness of the suction face 8 is so high that the accuracy of detection of the position of the electronic component 7 in image recognition cannot be enhanced.

Moreover, even when the area ratio of an area occupied by the second grains 17 to an area of the measurement face is greater than or equal to 17% but less than or equal to 34%, if the number of the second grains 17 in an area of 90 μm$^2$ in the measurement face exceeds 250, it means that a number of the second grains 17 of small crystal grain size are present. In the presence of the many second grains 17 of small crystal grain size, the amount of light absorbed by the second grains 17 decreases, with consequent emergence of great reflected light from the suction face 8 due to reflection through the first grains 16, and this makes it impossible to enhance the accuracy of detection of the position of the electronic component 7 in image recognition. On the other hand, even when the area ratio of an area occupied by the second grains 17 to an area of the measurement face is greater than or equal to 17% but less than or equal to 34%, if the number of the second grains 17 in an area of 90 μm$^2$ in the measurement face is less than 150, it means that a number of the second grains 17 of large crystal grain size are present. In the presence of the many second grains 17 of large crystal grain size, as the attachment and detachment of the electronic component 7 are repeated, shedding of the second grains 17 from the suction face 8 tends to occur, and consequently, an increase in reflectivity at a part undergoing grain drop makes it impossible to enhance the accuracy of detection of the position of the electronic component 7 in image recognition.

For example, the area ratio and the number of the second grains 17 in the measurement face can be determined by calculation in the following manner. At first, a given selected position in the measurement face is observed using the SEM of a magnification of 10000 times, and a photograph of an area of 90 μm$^2$ in the measurement face (for example, 11.5 μm in transverse length and 7.8 μm in longitudinal length)

is taken. Next, an image of the second grains 17 alone is extracted from the photograph. Then, the image is subjected to image analysis in accordance with a method known as particle analysis using Image Analysis Software "AZO-KUN" (trademark) manufactured by Asahi Kasei Engineering Corporation (in what follows, the term "Image Analysis Software "AZO-KUN"" refers to an image analysis software manufactured by Asahi Kasei Engineering Corporation throughout the description). As to conditions to be fulfilled in this analysis using "AZO-KUN", for example, the level of brightness of the particle is set to be "dark", and binarization method is set to be "automatic".

Moreover, in the suction nozzle 1 according to the present disclosure, in the measurement face, the average of distances between centroids of adjacent second grains 17 may be greater than or equal to 0.6 μm but less than or equal to 1.0 μm. As employed herein, the average of distances between centroids refers to a mean value of the shortest distances between the centroids of the adjacent second grains 17. That is, the average of distances between centroids is an index indicative of the degree of dispersion of the second grains 17. When the average of distances between centroids of the adjacent second grains 17 is greater than or equal to 0.6 μm but less than or equal to 1.0 μm, it is possible to reduce variations in reflected light resulting from unevenness in color and variations in mechanical strength in the suction face 8, and thereby achieve further enhancement in the accuracy of detection of the position of the electronic component 7 in image recognition.

Moreover, in the suction nozzle 1 according to the present disclosure, in the measurement face, the proportion in number of the second grains 17 having a grain size of greater than or equal to 0.6 μm in terms of equivalent circle diameter may be less than or equal to 25%. When the proportion in number of the second grains 17 having a grain size of greater than or equal to 0.6 μm in terms of equivalent circle diameter is less than or equal to 25%, the number of grain drop-prone second grains 17 is so small that grain drop caused by repeated attachment and detachment of the electronic component 7 can be less occurred. As employed herein, the equivalent circle diameter refers to the diameter of a circle corresponding to the observed area of the second grain 17.

As with the case of determining the area ratio and the number of the second grains 17 in the measurement face, the average of distances between centroids of the adjacent second grains 17 and the proportion in number of the second grains 17 having a grain size of greater than or equal to 0.6 μm in terms of equivalent circle diameter can be determined with use of Image Analysis Software "AZO-KUN". A method known as dispersibility measurement may be used to determine the average of distances between centroids of the adjacent second grains 17. On the other hand, a method known as particle analysis may be used to determine the proportion in number of the second grains 17 having a grain size of greater than or equal to 0.6 μm in terms of equivalent circle diameter.

Moreover, in the suction nozzle 1 according to the present disclosure, in the suction face 8, kurtosis Rku obtained from a roughness curve may be greater than 3 but less than or equal to 4.5. As employed herein, kurtosis Rku refers to an index indicative of kurtosis which is a measure of surface sharpness. At kurtosis Rku of 3, the kurtosis of a peak-forming part and a valley-forming part of the surface are defined by normal distribution. On the other hand, at kurtosis Rku that is greater than 3, the vertices of a peak-forming part and a valley-forming part are sharp-pointed.

When kurtosis Rku is greater than 3 but less than or equal to 4.5 in the suction face 8, the vertices of the peak-forming part and the valley-forming part are sharp-pointed, light is hard to be reflected from the vertices of the peak-forming part and the valley-forming part. Therefore, the reflectivity of the suction face 8, and achieve further enhancement in the accuracy of detection of the position of the electronic component 7 in image recognition.

Kurtosis Rku of the suction face 8 can be measured in conformity with JIS B 0601 (2001) with use of a commercially available contact-type or non-contact type surface roughness tester. As to measurement conditions, for example, measurement length may be set at 0.05 to 2.5 mm, cutoff value may be set at 0.005 to 0.8 mm, and scanning rate may be set at 0.03 to 1.5 mm/sec.

Moreover, in the suction nozzle 1 according to the present disclosure, in the suction face 8, skewness Rsk obtained from a roughness curve may be greater than 0. As employed herein, skewness Rsk refers to an index indicative of symmetry between a peak-forming part and a valley-forming part. At skewness Rsk that is greater than 0, the valley-forming part has a region larger than that of the peak-forming part.

When skewness Rsk is greater than 0 in the suction face 8, the valley-forming part has a larger region, light reflects irregularly in the region of the valley-forming part with high efficiency, and consequently the light is restrained from being reflected outwardly from the suction face 8. This makes it possible to achieve further enhancement in the accuracy of detection of the position of the electronic component 7 in image recognition.

As with the case of determining kurtosis Rku, skewness Rsk of the suction face 8 can be measured in conformity with JIS B 0601 (2001) with use of a commercially available contact-type or non-contact type surface roughness tester.

Moreover, in the first grains 16, the proportion of a total of tetragonal crystal and cubic crystal constituting zirconia may be greater than or equal to 80%. The fulfillment of this requirement helps increase the mechanical strength of the suction nozzle 1. The proportion can be determined by calculation on the basis of the reflection peak intensity of (111) plane, as well as (11-1) plane, of monoclinic crystal of zirconia and the reflection peak intensity of (111) planes of tetragonal crystal and cubic crystal, which have been obtained by performing X-ray diffraction measurement on the first grains 16, by utilizing the following equation:

$$(It(111)+Ic(111))/(Im(111)+Im(11\text{-}1)+It(111)+Ic(111))\times 100$$

wherein Im(111) represents the reflection peak intensity of (111) plane of monoclinic crystal; Im(11-1) represents the reflection peak intensity of (11-1) plane of monoclinic crystal; It(111) represents the reflection peak intensity of (111) plane of tetragonal crystal; and Ic(111) represents the reflection peak intensity of (111) plane of cubic crystal.

Adjustment of the proportion of the tetragonal crystal and cubic crystal of zirconia can be made with use of a stabilizing agent formed of, for example, at least one of yttrium oxide, cerium oxide, calcium oxide, and magnesium oxide. More specifically, in order to make the proportion of a total of the tetragonal crystal and the cubic crystal in the first grains 16 greater than or equal to 80%, zirconia may be stabilized by using the stabilizing agent in an amount of 2 to 8% by mole based on 100% by mole of the sum total of zirconia and the stabilizing agent.

Moreover, the average crystal grain size of the first grains 16 may be less than or equal to 0.5 μm in terms of equivalent circle diameter. When the average crystal grain size of the first grains 16 is less than or equal to 0.5 µm in terms of equivalent circle diameter, grain drop is less likely to occur. When the average crystal grain size of the first grains 16 is less than or equal to 0.45 µm in terms of equivalent circle diameter, grain drop is much less likely to occur.

As described earlier, the suction nozzle 1 according to the present disclosure includes, as a black-colored component, an oxide or composite oxide of elements belonging to Groups 4 to 10 in the periodic table. Since such black-colored components exhibit electrical conductivity, it follows that the suction nozzle 1 according to the present disclosure has a surface resistivity of $10^3$ to $10^{11}$ Ω, and thus exhibits semiconductivity. Hence, in the suction nozzle 1 according to the present disclosure, even if it is electrically charged with static electricity resulting from friction with air during high-speed travel, the static electricity can be removed via the holding member 11 and the placement machine 2. Moreover, static electricity borne on the attached electronic component 7 is less likely to be discharged rapidly, wherefore the electronic component 7 can be protected from discharge breakdown. A phenomenon in which the electronic component 7 is blown off by the repulsive force of static electricity as the suction nozzle 1 approaches the electronic component 7 may be less occurred.

The following describes an example of the method of manufacturing the suction nozzle 1 according to the present disclosure.

To begin with, with respect to 100 parts by mass of the sum total of zirconia powder containing a stabilizing agent (hereafter referred to simply as "zirconia powder") and black-colored component powder, 62.2 to 81.1 parts by mass of zirconia powder having an average grain size of 0.3 to 1.0 µm are weighed out, and, the zirconia powder in admixture with a solvent is pulverized by a ball mill or a bead mill until the average grain size falls in a range of 0.2 to 0.5 µm to form a first slurry.

Next, 18.9 to 37.8 parts by mass of black-colored component powder, which is a mixture of iron oxide powder, chromium oxide powder, and titanium oxide powder, having an average grain size of 0.3 to 2.0 µm are weighed out, and, the black-colored component powder in admixture with a solvent is pulverized by a ball mill or a bead mill until the average grain size falls in a range of 0.1 to 0.5 µm to form a second slurry. Although iron oxide powder, chromium oxide powder, and titanium oxide powder are used herein by way of example of the black-colored component powder, it is possible to use any other powdery material that imparts black color tone to zirconia ceramics when added, for example, manganese oxide or nickel oxide.

Moreover, as to balls or beads used in the mill, it is desirable to adopt those that do not affect the mechanical strength and the color tone of zirconia ceramics due to wear and abrasion. For example, for a ball's case, ceramic balls of black color are desirable for use, and more specifically balls formed of zirconia ceramics having a composition which is the same as or similar to that of the zirconia ceramics are desirable for use.

Next, an anion-based dispersant is added to the first slurry and the second slurry, and, after mixing them together, the mixture is spray-dried into granules by a spray dryer. The addition of the anion-based dispersant enables the second grains 17 to exist in a dispersed state without undergoing coagulation. In the compositions in the preparation stage as above described, by adding the anion-based dispersant in an amount of 0.1 to 1.0 part by mass to 100 parts by mass of the sum total of the zirconia powder and the black-colored component powder, it is possible to adjust the number of the second grains 17 in an area of 90 µm$^2$ in the measurement face of the suction face 8 to be greater than or equal to 150 but less than or equal to 250.

Next, the granules, a thermoplastic resin, wax, etc. are, after being put into a kneader, kneaded under heat to obtain a porcelain clay. The porcelain clay so obtained is put into a pelletizer for formation of pellets that are used as a raw material for injection molding. As the thermoplastic resin to be put into the kneader, for example, it is possible to use an ethylene-vinyl acetate copolymer, polystyrene, and an acrylic resin. The thermoplastic resin is advisably added in an amount of 10 to 25 parts by mass to 100 parts by mass of the sum total of the zirconia powder and the black-colored component powder. Moreover, as to conditions to be fulfilled in the kneading process using the kneader, heating temperature is set at 100 to 170° C., and kneading time is set at 0.5 to 3 hours.

In order to adjust the average of distances between centroids of the adjacent second grains 17 in the measurement face to be greater than or equal to 0.6 µm but less than or equal to 1.0 µm, kneading time in the kneading process using the kneader is set at 1.0 to 2.0 hours.

Next, the thereby obtained pellets are put into an injection molding machine for injection molding to obtain a molded body, and subsequently a runner of an excess of the raw material which has been cooled into a solid state is cut from the molded body.

In order to obtain the form of the suction nozzle 1 according to the present disclosure, in accordance with a customary injection molding method, a mold capable of obtaining a form of the suction nozzle 1 is prepared, and the mold is set in the injection molding machine for the injection molding process. Moreover, considering that the inner surface texture of the mold is transferred onto the surface of the molded body, in order to set kurtosis Rku to be greater than 3 but less than or equal to 4.5 or to set skewness Rsk to be greater than 0 in the suction face, a mold having an inner surface texture which lends itself to fulfillment of the above requirements may be used for the production of the molded body.

Next, the molded body is subjected to degreasing treatment, and whereafter fired at a temperature of 1300 to 1500° C. in an air atmosphere while being retained for 1 to 3 hours, whereby the zirconia ceramics-made suction nozzle 1 according to the present disclosure can be obtained.

In order to adjust the proportion in number of the second grains 17 having a grain size of greater than or equal to 0.6 µm in terms of equivalent circle diameter to be less than or equal to 25% in the measurement face, the firing process is advisably carried out at a temperature of 1300 to 1450° C. or below.

EXAMPLE 1

Suction nozzles with a variety of area ratios and a variety of numbers of the second grains in the measurement face were produced and were examined for accuracy of detection of electronic component position, where the area ratio is a ratio of an area occupied by the second grains to an area of the measurement face.

To begin with, black-colored component powder having an average grain size of 1.1 µm was prepared by mixing iron oxide powder, chromium oxide powder, and titanium oxide powder together in a mass ratio of 88:10:2. With respect to 100 parts by mass of the sum total of zirconia powder and the black-colored component powder, a predetermined amount, which was given in Table 1, of the black-colored component powder was weighed out. Then, the black-colored component powder in admixture with water serving as a solvent was pulverized into a slurry in a ball mill.

Stabilizing agent-containing zirconia powder having an average grain size of 0.7 μm was prepared, and, a predetermined amount, which was obtained by subtracting the corresponding addition amount of the black-colored component powder given in Table 1 from the amount of 100 parts by mass of the sum total of the zirconia powder and the black-colored component powder, of the zirconia powder was weight out. Then, the zirconia powder in admixture with water serving as a solvent was pulverized into a slurry in a ball mill.

Next, the thereby obtained slurries added with an anion-based dispersant in a predetermined amount given in Table 1 were mixed together, and the mixture was spray-dried into granules by a spray dryer. Note that the dispersant amount given in Table 1 corresponds to the proportion of the dispersant to be added to 100 parts by mass of the sum total of the zirconia powder and the black-colored component powder. Then, by a kneader, the granules so obtained were kneaded with an ethylene-vinyl acetate copolymer, polystyrene, an acrylic resin, and wax added in an amount of 20 parts by mass in total to 100 parts by mass of the sum total of the zirconia powder and the black-colored component powder. As to kneading conditions, kneading was performed for 0.5 hours, with the temperature kept at about 140° C., to produce a porcelain clay. Next, the thereby obtained porcelain clay was put in a pelletizer for formation of pellets used as a raw material for injection molding. The pellets were put into an injection molding machine to obtain a molded body which becomes a suction nozzle.

After being dried in a drying machine, the molded body was fired at a temperature of 1500° C. in an air while being retained for 1 hour to obtain a sintered compact. After that, a suction face of the obtained sintered compact of a suction nozzle was mirror-polished in the direction of length of the suction nozzle by an amount of about 1 μm with use of diamond abrasive grains.

Next, a measurement face which was the mirror-polished face was observed at a given selected position using the SEM at 10000-fold magnification, and a photograph of an area of 90 μm$^2$ in the measurement face (for example, 11.5 μm in transverse length and 7.8 μm in longitudinal length) was taken. Next, an image of the second grains alone was extracted from the photograph. Then, image analysis was performed on the image in accordance with a method known as particle analysis using Image Analysis Software "AZO-KUN" to determine the area ratio of an area occupied by the second grains to an area of the measurement face and the number of the second grains in an area of 90 μm$^2$ in the measurement face by calculation. As to conditions to be fulfilled in the analysis using "AZO-KUN", the level of brightness of the particle was set to be "dark", and binarization method was set to be "automatic".

Next, the accuracy of detection of electronic component position was examined. At first, each suction nozzle sample was attached to a placement machine via a holding member, and, the sample was subjected to 200000 cycles of testing operation including: taking an electronic component of Type 0603 (having dimensions of 0.6 mm by 0.3 mm) out of a tray; and placing the electronic component on a dummy substrate using a mounting apparatus having a structure as shown in FIG. 1 to determine the rate of occurrence of misplacement of the electronic component (number of times of occurrence/200000 cycles×100). The result is listed in Table 1.

TABLE 1

| Sample No. | Black-colored component powder (parts by mass) | Dispersant (parts by mass) | Area ratio (%) | Number of grains (pieces) | Rate of occurrence of misplacement (%) |
|---|---|---|---|---|---|
| *1 | 16.7 | Not contained | 15 | 130 | 1.00 |
| *2 | 16.7 | 0.30 | 15 | 186 | 0.70 |
| 3 | 18.9 | 0.35 | 17 | 192 | 0.05 |
| 4 | 30.0 | 0.40 | 27 | 201 | 0.01 |
| 5 | 37.8 | 0.45 | 34 | 211 | 0.04 |
| *6 | 40.0 | 0.50 | 36 | 223 | 0.50 |
| *7 | 30.0 | Not contained | 27 | 141 | 0.30 |
| 8 | 30.0 | 0.10 | 27 | 150 | 0.03 |
| 9 | 30.0 | 1.00 | 27 | 250 | 0.02 |
| *10 | 30.0 | 1.20 | 27 | 261 | 0.10 |
| *11 | 40.0 | 1.50 | 36 | 267 | 1.00 |

*is indicative of departure from the scope of the invention.

As will be understood from the result given in Table 1, Sample Nos. 1 and 2 in which the area ratio of an area occupied by the second grains to an area of the measurement face of the suction nozzle is less than 17% have incurred misplacement at an occurrence rate of greater than or equal to 0.70%. This is because, in Sample Nos. 1 and 2, high brightness of the suction face has led to emergence of great reflected light from the suction face, causing a decline in the accuracy of detection of electronic component position in image recognition. Furthermore, Sample Nos. 6 and 11 in which the area ratio of an area occupied by the second grains to an area of the measurement face of the suction nozzle is greater than 34% have incurred misplacement at an occurrence rate of greater than or equal to 0.50%. This is because, in Sample Nos. 6 and 11, the mechanical strength is so low that grain drop has occurred in the suction face during 200000 cycles of electronic component attachment-detachment operation, causing an increase in reflectivity at the part undergoing grain drop.

Also, Sample No. 7, in which the area ratio of an area occupied by the second grains to an area of the measurement face of the suction nozzle falls in the range of 17% or above to 34% or below but the number of the second grains is less than 150, has incurred misplacement at an occurrence rate of as high as 0.30%. This is because, in Sample No. 7, in the presence of a number of second grains of large crystal grain size in the suction face, shedding of the second grains from the suction face has occurred during 200000 cycles of electronic component attachment-detachment operation, causing an increase in reflectivity at the part undergoing grain drop. Furthermore, Sample No. 10, in which the area ratio of an area occupied by the second grains to an area of the measurement face of the suction nozzle falls in the range of 17% or above to 34% or below but the number of the second grains is greater than 250, has incurred misplacement at an occurrence rate of as high as 0.10%. This is because Sample No. 10 includes a number of second grains of small crystal grain size at the suction face thereof, the second grains absorb a small amount of light, and with consequent emergence of great reflected light from the suction face reflects the light in large amount due to reflection at the first grains.

On the other hand, Sample Nos. 3 to 5 and Nos. 8 and 9, in which the area ratio of an area occupied by the second grains to an area of the measurement face of the suction nozzle is greater than or equal to 17% but less than or equal to 34% and the number of the second grains in an area of 90 µm$^2$ in the measurement face is greater than or equal to 150 but less than or equal to 250, have incurred misplacement at a low occurrence rate of less than or equal to 0.05%. This is because, in Sample Nos. 3 to 5 and Nos. 8 and 9, there was little grain drop even after 200000th cycle of electronic component attachment-detachment operation, and, by virtue of the black color tone with low reflectivity, detection of electronic component position in image recognition has been achieved with high accuracy. It has thus been found that the application of such a suction nozzle to a placement machine makes it possible to enhance the accuracy of mounting electronic components.

EXAMPLE 2

Next, there were produced samples which differed from one another in the average of distances between centroids of adjacent second grains for examination of the accuracy of detection of electronic component position. The method of production in use was the same as that adopted in the formation of Sample No. 4 of Example 1, except that time of kneading using a kneader was set at the time given in Table 2. Moreover, Sample No. 16 is identical with Sample No. 4 of Example 1.

In accordance with the same procedure as adopted in Example 1, after forming an image of the second grains alone by image extraction, image analysis was performed on the image by a method known as dispersibility measurement using Image Analysis Software "AZO-KUN" to determine the average of distances between centroids of adjacent second grains in the measurement face by calculation.

Next, determination as to the rate of occurrence of misplacement of the electronic component was conducted by the same method as adopted in Example 1 to examine the accuracy of detection of electronic component position. The result is listed in Table 2.

TABLE 2

| Sample No. | Kneading time (hr) | Average of distances between centroids (µm) | Rate of occurrence of misplacement (%) |
| --- | --- | --- | --- |
| 12 | 3.0 | 0.4 | 0.013 |
| 13 | 2.0 | 0.6 | 0.008 |
| 14 | 1.5 | 0.8 | 0.006 |
| 15 | 1.0 | 1.0 | 0.007 |
| 16 | 0.5 | 1.2 | 0.010 |

As will be understood from the result given in Table 2, Sample Nos. 13 to 15, in which the average of distances between centroids of adjacent second grains in the measurement face of the suction nozzle falls in the range of 0.6 µm to 1.0 µm, have incurred misplacement at a low occurrence rate of less than or equal to 0.008%. This is because, in Sample Nos. 13 to 15, the second grains exist in a dispersed state in the suction face, wherefore unevenness in color and variations in mechanical strength in the suction face are so little that further enhancement in the accuracy of detection of electronic component position has been achieved. It has thus been found that the application of such a suction nozzle to a placement machine makes it possible to attain higher mounting accuracy.

EXAMPLE 3

Next, there were produced samples which differed from one another in the proportion in number of the second grains having a grain size of greater than or equal to 0.6 µm in terms of equivalent circle diameter for examination of the accuracy of detection of electronic component position. The method of production in use was the same as that adopted in the formation of Sample No. 14 of Example 2, except that firing temperature was set at the temperature given in Table 3. Moreover, Sample No. 19 is identical with Sample No. 14 of Example 2.

In accordance with the same procedure as adopted in Example 1, after forming an image of the second grains alone by image extraction, image analysis was performed on the image by a method known as particle analysis using Image Analysis Software "AZO-KUN" to determine the proportion in number of the second grains having a grain size of greater than or equal to 0.6 µm in terms of equivalent circle diameter in the measurement face (abundance ratio) by calculation.

Next, determination as to the rate of occurrence of misplacement of the electronic component was conducted by the same method as adopted in Example 1 to examine the accuracy of detection of electronic component position. The result is listed in Table 3. In Table 3, the proportion in number of the second grains having a grain size of greater than or equal to 0.6 µm in terms of equivalent circle diameter in the measurement face is expressed simply as "Proportion".

TABLE 3

| Sample No. | Firing temperature (° C.) | Proportion (%) | Rate of occurrence of misplacement (%) |
| --- | --- | --- | --- |
| 17 | 1350 | 13 | 0.002 |
| 18 | 1450 | 25 | 0.003 |
| 19 | 1500 | 27 | 0.006 |

As will be understood from the result given in Table 3, Sample Nos. 17 and 18, in which the proportion in number of the second grains having a grain size of greater than or equal to 0.6 µm in terms of equivalent circle diameter is less than or equal to 25% in the measurement face of the suction nozzle, have incurred misplacement at a very low occurrence rate of less than or equal to 0.003%. This is because, in Sample Nos. 17 and 18, the number of grain drop-prone second grains is so small that shedding of the second grains from the suction face has been improved even after 200000th cycle of electronic component attachment-detachment operation. It has thus been found that the application of such a suction nozzle to a placement machine makes it possible to attain even higher mounting accuracy.

EXAMPLE 4

Next, there were produced samples which differed from one another in kurtosis Rku obtained from a roughness curve in the suction face for examination of the accuracy of detection of electronic component position. The method of production in use was the same as that adopted in the formation of Sample No. 4 of Example 1, except that the inner surface texture of a mold placed in an injection molding machine was changed so as to obtain kurtosis Rku values as given in Table 4. Moreover, Sample No. 20 is identical with Sample No. 4 of Example 1.

Kurtosis Rku of the suction face of each sample was measured in conformity with JIS B 0601 (2001) with use of a commercially available non-contact type surface roughness tester. As to conditions to be fulfilled in the measurement, measurement length was set at 0.25 mm, cutoff value was set at 0.025 mm, and scanning rate was set at 0.3 mm/sec.

Next, determination as to the rate of occurrence of misplacement of the electronic component was conducted by the same method as adopted in Example 1 to examine the accuracy of detection of electronic component position. The result is listed in Table 4.

TABLE 4

| Sample No. | Kurtosis Rku | Rate of occurrence of misplacement (%) |
| --- | --- | --- |
| 20 | 2.9 | 0.010 |
| 21 | 3.1 | 0.008 |
| 22 | 3.4 | 0.007 |
| 23 | 4.1 | 0.006 |
| 24 | 4.5 | 0.008 |
| 25 | 4.6 | 0.010 |

As will be understood from the result given in Table 4, Sample Nos. 21 to 24, in which kurtosis Rku obtained from a roughness curve is greater than 3 but less than or equal to 4.5 in the suction face of the suction nozzle, have incurred misplacement at a low occurrence rate of less than or equal to 0.008%. This is because, in Sample Nos. 21 to 24, the suction face has a surface texture with low reflectivity, wherefore detection of electronic component position in image recognition has been achieved with high accuracy. It has thus been found that the application of such a suction nozzle to a placement machine makes it possible to attain even higher mounting accuracy.

EXAMPLE 5

Next, there were produced samples which differed from one another in skewness Rsk obtained from a roughness curve in the suction face for examination of the accuracy of detection of electronic component position. The method of production in use was the same as that adopted in the formation of Sample No. 23 of Example 4, except that the inner surface texture of a mold placed in an injection molding machine was changed so as to obtain skewness Rsk values as given in Table 5. Moreover, Sample No. 26 is identical with Sample No. 23 of Example 4.

Skewness Rsk of the suction face of each sample was measured under the same conditions as those adopted in Example 4 with use of a commercially available non-contact type surface roughness tester.

Next, determination as to the rate of occurrence of misplacement of the electronic component was conducted by the same method as adopted in Example 1 to examine the accuracy of detection of electronic component position. The result is listed in Table 5.

TABLE 5

| Sample No. | Skewness Rsk | Rate of occurrence of misplacement (%) |
| --- | --- | --- |
| 26 | −0.5 | 0.006 |
| 27 | 0.5 | 0.004 |

TABLE 5-continued

| Sample No. | Skewness Rsk | Rate of occurrence of misplacement (%) |
| --- | --- | --- |
| 28 | 0.7 | 0.003 |
| 29 | 1.0 | 0.003 |

As will be understood from the result given in Table 5, Sample Nos. 27 to 29, in which skewness Rsk obtained from a roughness curve is greater than 0 in the suction face of the suction nozzle, have incurred misplacement at a very low occurrence rate of less than or equal to 0.004%. This is because, in Sample Nos. 27 to 29, the suction face has a surface texture with lower reflectivity, wherefore detection of electronic component position in image recognition has been achieved with higher accuracy. It has thus been found that the application of such a suction nozzle to a placement machine makes it possible to attain even higher mounting accuracy.

What is claimed is:

1. A suction nozzle comprising:
   zirconia-based ceramics containing:
      first grains containing zirconia and
      second grains containing a component of a black color,
   a suction face comprising a measurement face that is obtained by polishing the suction face for measurements, the measurement face having:
      a ratio of a total area of the second grains within the measurement face to an area of the measurement face of 17% to 34%; and
      a number of the second grains in an area of 90 $\mu m^2$ in the measurement face of 150 to 250, wherein the number of the second grains is measured by an image analysis of the measurement surface; and
   a suction hole in communication with the suction face.

2. The suction nozzle according to claim 1, wherein an average of distances between centroids of adjacent second grains in the measurement face is 0.6 $\mu m$ to 1.0 $\mu m$.

3. The suction nozzle according to claim 1, wherein a proportion in number of the second grains having a grain size of 0.6 $\mu m$ or more in the measurement face in terms of equivalent circle diameter to a number of all of the second grains is 25% or less.

4. A suction nozzle comprising:
   zirconia-based ceramics containing:
      first grains containing zirconia and
      second grains containing a component of a black color,
   a suction face comprising a measurement face that is obtained by polishing the suction face for measurements, the measurement face having:
      a ratio of a total area of the second grains within the measurement face to an area of the measurement face of 17% to 34%; and
      a number of the second grains in an area of 90 $\mu m^2$ in the measurement face of 150 to 250; and
   a suction hole in communication with the suction face, wherein kurtosis Rku obtained from a roughness curve in the suction face is greater than 3 and less than or equal to 4.5.

5. A suction nozzle comprising:
   zirconia-based ceramics containing:
      first grains containing zirconia and
      second grains containing a component of a black color, a suction face comprising a measurement face that is obtained by polishing the suction face for measurements, the measurement face having:
- a ratio of a total area of the second grains within the measurement face to an area of the measurement face of 17% to 34%; and
- a number of the second grains in an area of 90 $\mu m^2$ in the measurement face of 150 to 250; and a suction hole in communication with the suction face, wherein skewness Rsk obtained from a roughness curve in the suction face is greater than 0.

\* \* \* \* \*